United States Patent
Sasaki et al.

(10) Patent No.: US 10,164,017 B2
(45) Date of Patent: *Dec. 25, 2018

(54) METHOD OF FORMING A SEMICONDUCTOR DEVICE HAVING IMPURITY REGION

(71) Applicant: SAMSUNG ELECTRONICS CO., LTD., Suwon-si, Gyeonggi-do (KR)

(72) Inventors: Yuichiro Sasaki, Seoul (KR); Bong Soo Kim, Hwaseong-si (KR); Tae Gon Kim, Seoul (KR); Yoshiya Moriyama, Seongnam-si (KR); Seung Hyun Song, Hwaseong-si (KR); Alexander Schmidt, Suwon-si (KR); Abraham Yoo, Hwaseong-si (KR); Heung Soon Lee, Pohang-si (KR); Kyung In Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/887,773

(22) Filed: Feb. 2, 2018

(65) Prior Publication Data

US 2018/0158911 A1    Jun. 7, 2018

Related U.S. Application Data

(63) Continuation of application No. 15/424,081, filed on Feb. 3, 2017, now Pat. No. 9,911,809.

(30) Foreign Application Priority Data

Jun. 23, 2016  (KR) .................. 10-2016-0078516

(51) Int. Cl.
*H01L 29/10*  (2006.01)
*H01L 29/08*  (2006.01)
(Continued)

(52) U.S. Cl.
CPC .. *H01L 29/1083* (2013.01); *H01L 21/823814* (2013.01); *H01L 21/823821* (2013.01);
(Continued)

(58) Field of Classification Search
CPC ............. H01L 29/1083; H01L 29/0847; H01L 29/66537; H01L 29/7851; H01L 27/0924;
(Continued)

(56) References Cited

U.S. PATENT DOCUMENTS 7,067,881 B2  6/2006  Matsumoto et al.
7,723,797 B2  5/2010  Kim et al.
(Continued)

FOREIGN PATENT DOCUMENTS

KR    10-2000-0056248 A    9/2000
KR       10-0731105 B1      6/2007

*Primary Examiner* — Caleen Sullivan
(74) *Attorney, Agent, or Firm* — Lee & Morse, P.C.

(57) ABSTRACT

A semiconductor device having an impurity region is provided. The semiconductor device includes a fin active region having protruding regions and a recessed region between the protruding regions. Gate structures overlapping the protruding regions are disposed. An epitaxial layer is disposed in the recessed region to have a height greater than a width. An impurity region is disposed in the fin active region, surrounds side walls and a bottom of the recessed region, has the same conductivity type as a conductivity type of the epitaxial layer, and includes a majority impurity that is different from a majority impurity included in at least a portion of the epitaxial layer.

20 Claims, 15 Drawing Sheets

(51) Int. Cl.
*H01L 29/66* (2006.01)
*H01L 29/78* (2006.01)
*H01L 27/092* (2006.01)
*H01L 21/8238* (2006.01)
*H01L 21/223* (2006.01)
*H01L 21/265* (2006.01)

(52) U.S. Cl.
CPC .. *H01L 21/823892* (2013.01); *H01L 27/0921* (2013.01); *H01L 27/0924* (2013.01); *H01L 29/0847* (2013.01); *H01L 29/66537* (2013.01); *H01L 29/66545* (2013.01); *H01L 29/66636* (2013.01); *H01L 29/66795* (2013.01); *H01L 29/7851* (2013.01); *H01L 21/2236* (2013.01); *H01L 21/26586* (2013.01)

(58) Field of Classification Search
CPC ....... H01L 29/66795; H01L 21/823892; H01L 21/823814; H01L 29/66636; H01L 21/823821; H01L 27/0921

USPC .................................. 257/365, 368, 335, 51
See application file for complete search history.

(56) References Cited

U.S. PATENT DOCUMENTS

| | | | |
|---|---|---|---|
| 7,754,556 | B2 | 7/2010 | Feudel et al. |
| 8,062,948 | B2 | 11/2011 | Shin |
| 8,193,065 | B2 | 6/2012 | Johnson et al. |
| 8,207,523 | B2 | 6/2012 | Tsai et al. |
| 8,916,437 | B2 | 12/2014 | Grupp et al. |
| 9,263,345 | B2 | 2/2016 | Goto et al. |
| 9,911,809 | B2 * | 3/2018 | Sasaki ................ H01L 29/1083 |
| 2003/0186492 | A1 | 10/2003 | Brown et al. |
| 2009/0020819 | A1 | 1/2009 | Anderson et al. |
| 2011/0147848 | A1 | 6/2011 | Kuhn et al. |
| 2014/0159144 | A1 | 6/2014 | Cheng |
| 2014/0170828 | A1 | 6/2014 | Lee et al. |
| 2015/0270332 | A1 | 9/2015 | Harley et al. |

* cited by examiner

US 10,164,017 B2

METHOD OF FORMING A SEMICONDUCTOR DEVICE HAVING IMPURITY REGION

CROSS-REFERENCE TO RELATED APPLICATIONS

This is a continuation application based on pending application Ser. No. 15/424,081, filed Feb. 3, 2017, the entire contents of which is hereby incorporated by reference.

Korean Patent Application No. 10-2016-0078516, filed on Jun. 23, 2016, in the Korean Intellectual Property Office, and entitled: "Semiconductor Device Having Impurity Region," is incorporated by reference herein in its entirety.

BACKGROUND

1. Field

Embodiments relate to a semiconductor device having an impurity region and a method of forming the same.

2. Description of the Related Art

With the current trend toward the high integration of semiconductor devices, the size of fin field effect transistor (FinFET) device has gradually been reduced. However, this gradual reduction in size of FinFET device may cause difficulties in forming a channel between the source and the drain of the FinFET device, in order to form at a desired length without the arising of any defects.

SUMMARY

In accordance with an embodiment, a semiconductor device may be provided. The semiconductor device may include a fin active region having protruding regions and a recessed region between the protruding regions. Gate structures overlapping the protruding regions may be disposed. An epitaxial layer may be disposed in the recessed region to have a height greater than a width. An impurity region may be disposed in the fin active region, may surround side walls and a bottom of the recessed region, may have the same conductivity type as a conductivity type of the epitaxial layer, and may have a majority impurity different from a majority impurity included in at least a portion of the epitaxial layer.

In accordance with an embodiment, a semiconductor device may be provided. The semiconductor device may include a first fin active region passing through a first isolation region, and protruding from the first isolation region. The first fin active region may include protruding regions and a recessed region between the protruding regions. The recessed region may have a depth greater than a width. First gate structures may overlap the protruding regions of the first fin active region. First insulating spacers may be disposed on lateral surfaces of the first gate structures. A first epitaxial layer may fill the recessed region. An impurity region may surround lateral surfaces and a bottom surface of the first epitaxial layer, and may have the same conductivity type as a conductivity type of the first epitaxial layer. Side walls of the recessed region may overlap bottoms of the first insulating spacers while being spaced apart from the first gate structures.

In accordance with an embodiment, a semiconductor device may be provided. The semiconductor device may include a fin active region having protruding regions and a recessed region between the protruding regions, the fin active regions extending along a second direction. Gate structures may overlap the protruding regions and may extend along a third direction, orthogonal to the second direction. An epitaxial layer may be in the recessed region, having a thickness in a first direction, orthogonal to the second and third directions, greater than a width in the second direction. An impurity region in the fin active region may surround side walls and a bottom of the recessed region. The impurity region and the epitaxial layer having a same conductivity type, while the impurity region having a majority impurity different from a majority impurity in at least a portion of the epitaxial layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
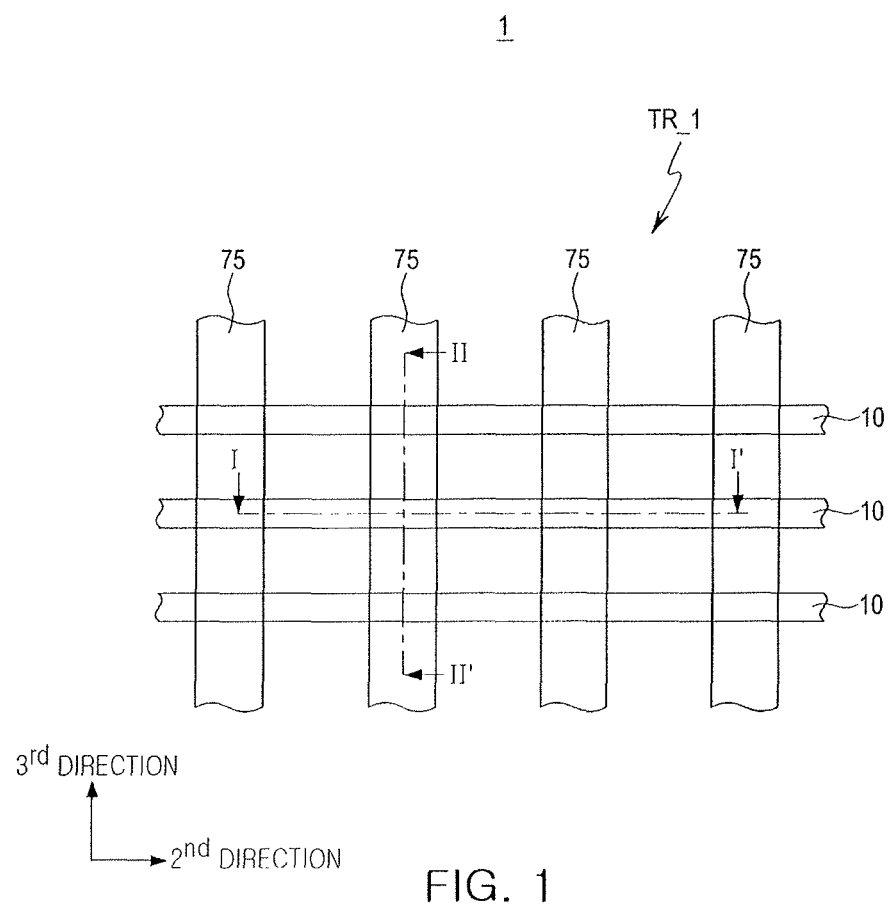
FIG. 1 illustrates a plan view of a semiconductor device according to an example embodiment.
Figure 2A:
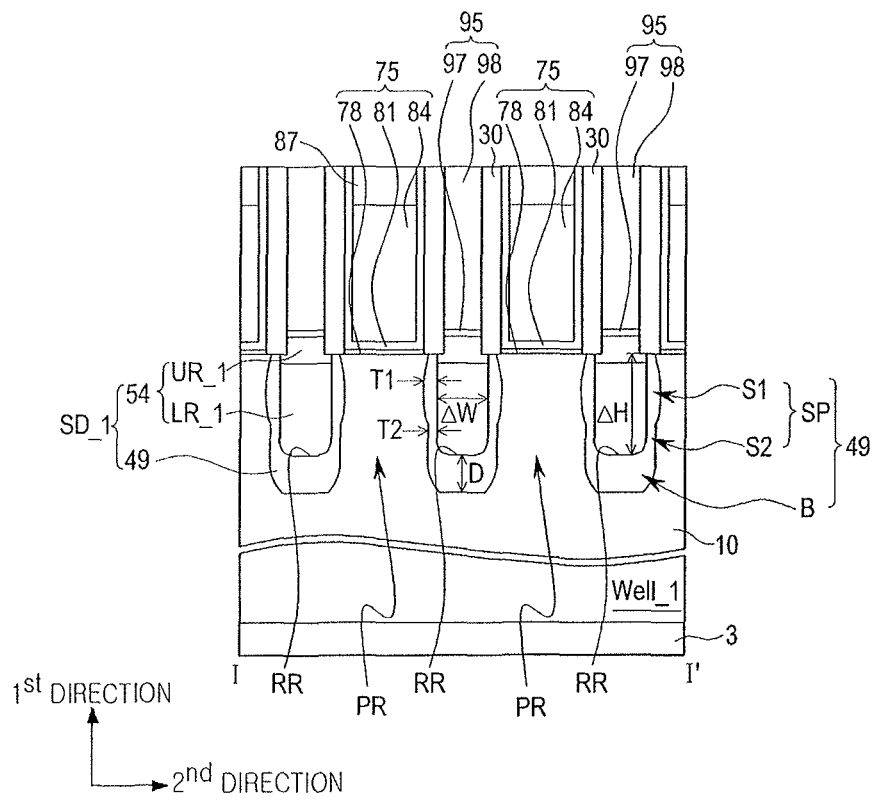
FIGS. 2A and 2B illustrate cross-sectional views of an example of a semiconductor device according to an example embodiment.
Figure 2B:
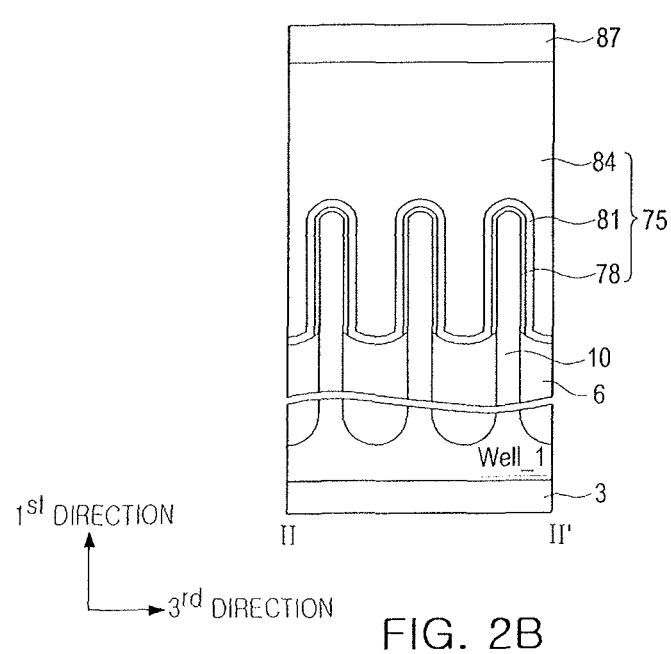

FIG. 1 is a plan view of a semiconductor device 1 according to an example embodiment of the inventive concept. FIGS. 2A and 2B are cross-sectional views of an example of the semiconductor device 1 according to an example embodiment of the inventive concept. FIG. 2A is a cross-sectional view of a region taken along line I-I' of FIG. 1, and FIG. 2B is a cross-sectional view of a region taken along line II-II' of FIG. 1.

Referring to FIGS. 1, 2A, and 2B, a substrate 3 including a first transistor region TR_1 may be provided. The substrate 3 may be a semiconductor substrate that may be formed of a semiconductor material, such as silicon (Si). The substrate 3 of the first transistor region TR_1 may have a first well region Well_1. The substrate 3 of the first transistor region TR_1 may also have a first isolation region 6 disposed thereon. The first isolation region 6 may be formed of an insulating material, such as a silicon oxide.

The substrate 3 of the first transistor region TR_1 may have a first fin active region 10 disposed thereon to pass through the first isolation region 6 and protrude from the first isolation region 6 along a first direction, e.g., orthogonal to the substrate 3. Each of the first fin active region 10 and the first well region Well_1 may have a first conductivity type. The first fin active region 10 may have a line or a bar shape, e.g., may extend along a second direction, orthogonal to the first direction.

First gate structures 75 may extend onto the first isolation region 6, e.g., along the first direction, while intersecting the first fin active region 10, e.g., may extend along a third direction orthogonal to the first and second direction. Where the first gate structures 75 intersect the first fin active region 10, they may overlap the first fin active region 10 in the first direction and partially overlap the first fin active region in the third direction. Each of the first gate structures 75 may include a first interface oxide layer 78, a first gate dielectric layer 81, and a first gate electrode 84. The first gate electrode 84 may extend onto the first isolation region 6 while intersecting the first fin active region 10, the first gate dielectric layer 81 may cover a bottom surface and lateral surfaces of the first gate electrode 84, and the first interface oxide layer 78 may be disposed between the first gate dielectric layer 81 and the first fin active region 10. The first gate dielectric layer 81 may be formed of a high-k dielectric material.

The first gate structures 75 may have first gate capping patterns 87 disposed thereon. The first gate structures 75 and the first gate capping patterns 87 may have first insulating spacers 30 disposed on lateral surfaces thereof.

The first fin active region 10 may have first protruding regions PR and first recessed regions RR between the first protruding regions PR. A single first recessed region RR may be disposed between a pair of first protruding regions PR that are adjacent to each other, among the first protruding regions PR. Each of the first recessed regions RR may be disposed between first protruding regions PR that are adjacent to each other. The first gate structures 75 may overlap the first protruding regions PR, e.g. along the first direction. The first gate structures 75 may be narrower than the first protruding regions PR, e.g., a widest portion thereof along the second direction.

The substrate 3 of the first transistor region TR_1 may have first epitaxial layers 54 disposed thereon. The first epitaxial layers 54 may be disposed in the first recessed regions RR of the first fin active region 10.

In an example embodiment, each of the first epitaxial layers 54 may include a first lower region LR_1 and a first upper region UR_1 disposed on the first lower region LR_1. The first lower region LR_1 may fill the first recessed region RR, and the first upper region UR_1 may extend from the first lower region LR_1 along the first direction to a space between the first gate structures 75. The first upper region UR_1 may be narrower than the first lower region LR_1, e.g., at a narrowest part thereof along the second direction.

In an example embodiment, each of the first recessed regions RR may have a depth $\Delta H$ along the first direction greater than a width $\Delta W$ along the second direction. Thus, each of the first lower regions LR_1 of the first epitaxial layers 54 filling the first recessed regions RR may have a height $\Delta H$ greater than a width $\Delta W$. In other words, each of the first lower regions LR_1 may have a high aspect ratio relative to the first direction.

The first epitaxial layers 54 may have first contact structures 95, disposed thereon, having conductive properties. Each of the first contact structures 95 may include a metal silicide layer 97 and a contact plug 98 disposed on the metal silicide layer 97.

The first insulating spacers 30 may extend along the first direction between the first gate structures 75 and the first contact structures 95, while being interposed between the first gate structures 75 and the first upper regions UR_1 of the first epitaxial layers 54.

In an example embodiment, side walls of the first recessed regions RR, e.g., the first upper regions UR_1, may be in contact, e.g., direct contact, with bottoms of the first insulating spacers 30 and a portion of sidewalls of the first insulating spacers 30. Side walls of the first recessed regions RR may overlap, e.g., partially overlap, the bottoms of the first insulating spacers 30. The side walls of the first recessed regions RR may be spaced apart from the first gate structures 75. Here, the side walls of the first recessed regions RR may also be understood as lateral surfaces extending from the first lower regions LR_1 of the first epitaxial layers 54 included in the first recessed regions RR. Lateral surfaces of the first protruding regions PR may also contact, e.g., directly contact, bottom of the first insulating spacers 30.

Impurity regions 49 may be disposed in portions of the first fin active region 10 adjacent to the first epitaxial layers 54. In the first fin active region 10, the impurity regions 49 may be spaced apart from each other along the second direction.

The impurity regions 49 and the first epitaxial layers 54 may have the same conductivity type as each other. The impurity regions 49 and the first epitaxial layers 54 may have conductivity types different from those of the first fin active region 10 and the first well region Well_1. For example, when each of the first well region Well_1 and the first fin active region 10 has a P conductivity type, each of the impurity regions 49 and the first epitaxial layers 54 may have an N conductivity type. Thus, the impurity regions 49 and the first epitaxial layers 54 may form first source/drain regions SD_1 of an N-channel metal oxide semiconductor (NMOS) transistor. As a result, the first transistor region TR_1 may be an NMOS transistor region. However, embodiments are not limited thereto. For example, when each of the first well region Well_1 and the first fin active region 10 has an N conductivity type, each of the impurity regions 49 and the first epitaxial layers 54 may have a P conductivity type.

In an example embodiment, a majority impurity included in the impurity regions 49 may be different from a majority impurity included in the first lower regions LR_1 of the first epitaxial layers 54. For example, the majority impurity included in the impurity regions 49 may be a first element, and the majority impurity included in the first lower regions LR_1 of the first epitaxial layers 54 may be a second element, different from the first element. The first element may have a lower degree of diffusion than the second element. For example, the first element may have a diffusion rate less than that of the second element in the first fin active region 10. The first element may be arsenic (As) and the second element may be phosphorus (P).

In an example embodiment, at least a portion of each of the first insulating spacers 30 may include the first element forming the majority impurity included in the impurity regions 49.

In an example embodiment, in the first epitaxial layers 54, the majority impurity included in the first lower regions LR_1 and a majority impurity included in the first upper regions UR_1 may be the same element, for example, phosphorus (P). However, embodiments are not limited thereto. For example, the first lower regions LR_1 and the first upper regions UR_1 of the first epitaxial layers 54 may include different elements as majority impurities. For example, the first lower regions LR_1 may include phosphorus (P) as a majority impurity, and the first upper regions UR_1 may include arsenic (As) as a majority impurity.

In an example embodiment, the first upper regions UR_1 of the first epitaxial layers 54 may have a higher impurity concentration than that of the first lower regions LR_1. In another example embodiment, the first upper regions UR_1 of the first epitaxial layers 54 may have a higher impurity concentration than those of the first lower regions LR_1 and the impurity regions 49. In another example embodiment, the impurity regions 49 may have a higher impurity concentration than that of at least portions of the first lower regions LR_1.

In a modified example embodiment, the first lower regions LR_1 of the first epitaxial layers 54 may include portions having different impurity concentrations. An example of the first lower regions LR_1 of the first epitaxial layers 54 including the portions having different impurity concentrations will be described with reference to FIG. 3.

Figure 3:
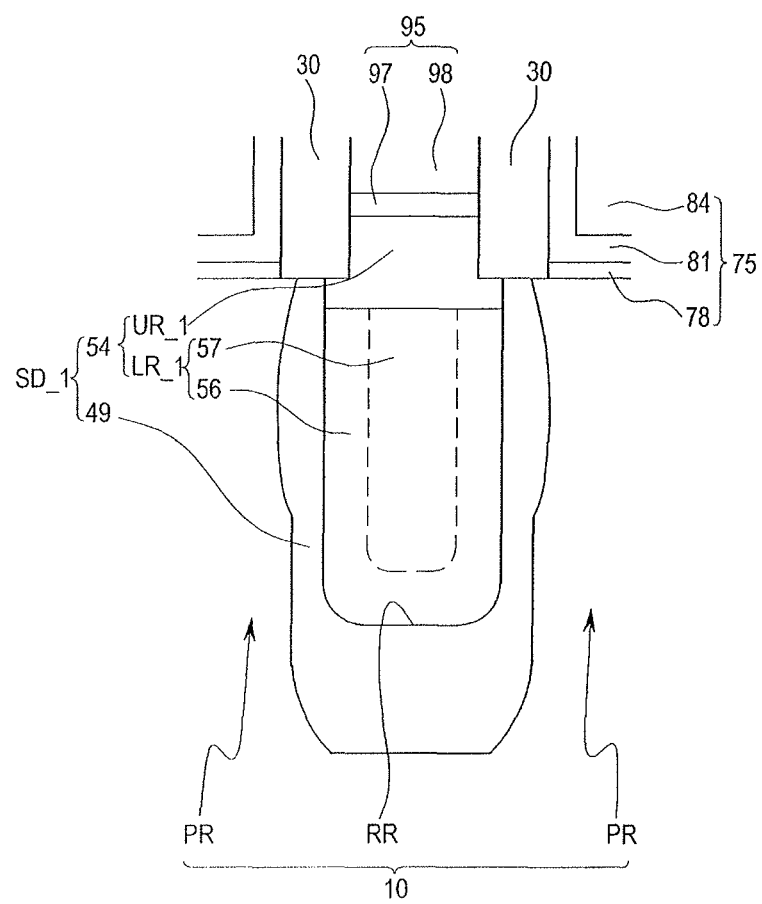
FIG. 3 illustrates a cross-sectional view of a modification of a semiconductor device according to an example embodiment.

Referring to FIG. 3, each of the first lower regions LR_1 of the first epitaxial layers 54 may include a low concentration region 56 and a high concentration region 57, having a higher impurity concentration than that of the low concentration region 56.

The low concentration regions 56 may be adjacent or closer to the impurity regions 49 than the high concentration regions 57 are. The high concentration regions 57 may be disposed in the centers of the first epitaxial layers 54. Upper portions of the high concentration regions 57 may be covered by the first upper regions UR_1, and lateral surfaces and bottom surfaces of the high concentration regions 57 may be surrounded by the low concentration regions 56 other than on a top surface thereof.

Returning to FIGS. 2A and 2B, the impurity regions 49 may include side portions SP, adjacent to side walls of the first recessed regions RR, and bottom portions B, disposed below bottoms of the first recessed regions RR. In the impurity regions 49, horizontal widths T1 and T2 of each of the side portions SP along the second direction may be narrower than a vertical length D of each of the bottom portions B along the first direction.

Each of the side portions SP of the impurity regions 49 may include a first portion S1 and a second portion S2 having different widths along the second direction. In the side portions SP of the impurity regions 49, the second portion S2 may be disposed below the first portion S1, and may have the horizontal width T2 that is narrower than the horizontal width T1 of the first portion S1 along the second direction.

Figure 4:
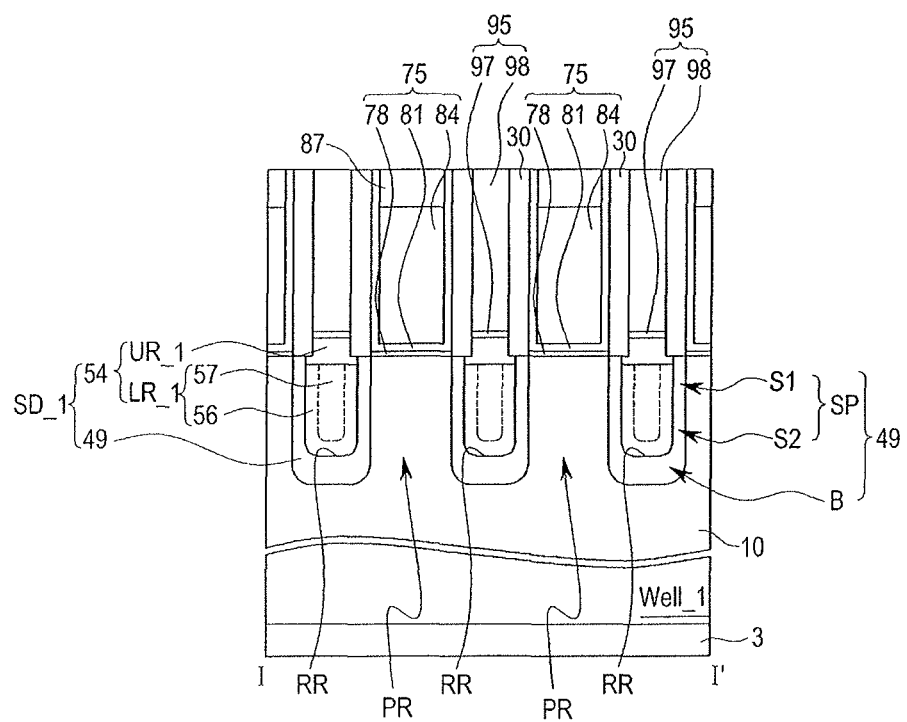
FIG. 4 illustrates a cross-sectional view of another modification of a semiconductor device according to an example embodiment.

Each of the side portions SP of the impurity regions 49 may include portions having different widths. However, embodiments are not limited thereto. For example, as illustrated in FIG. 4, the impurity regions 49 may have side portions SP having substantially uniform horizontal widths.

Embodiments are not limited to a semiconductor device including the first transistor region TR_1 that may include the components illustrated in FIGS. 1 through 4. A semiconductor device 100, including a second transistor region TR_2, will hereinafter be described, along with the first transistor region TR_1, which may include the components illustrated in FIGS. 1 through 4, with reference to FIGS. 5, 6A, and 6B.

Figure 5:
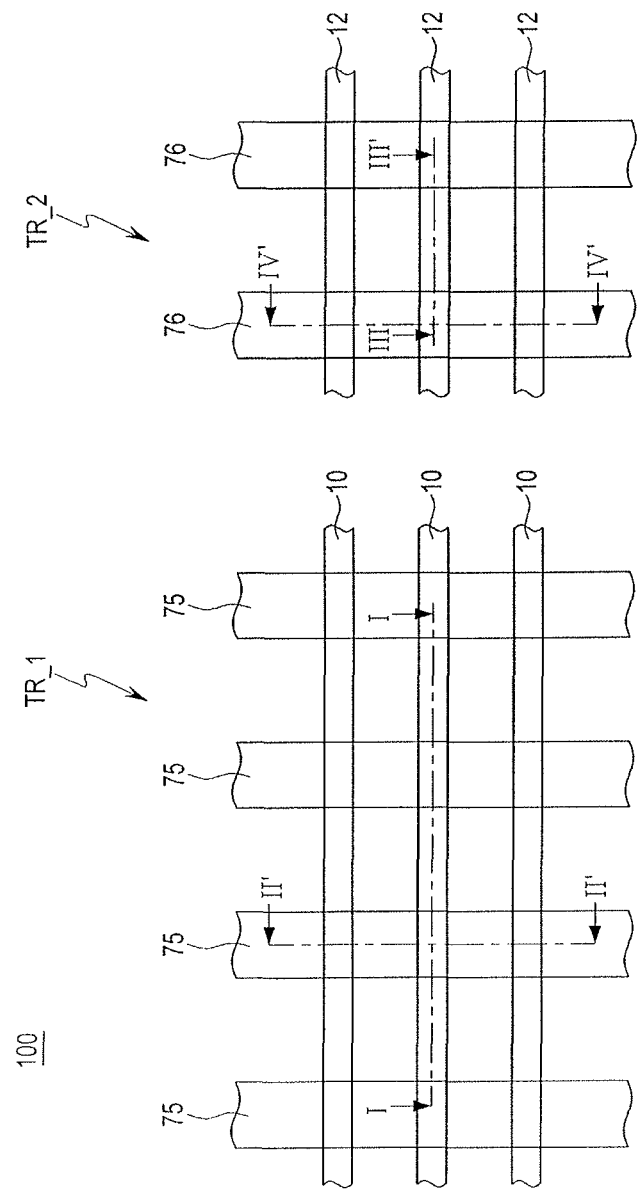
FIG. 5 illustrates a plan view of another modification of a semiconductor device according to an example embodiment.
Figure 6A:
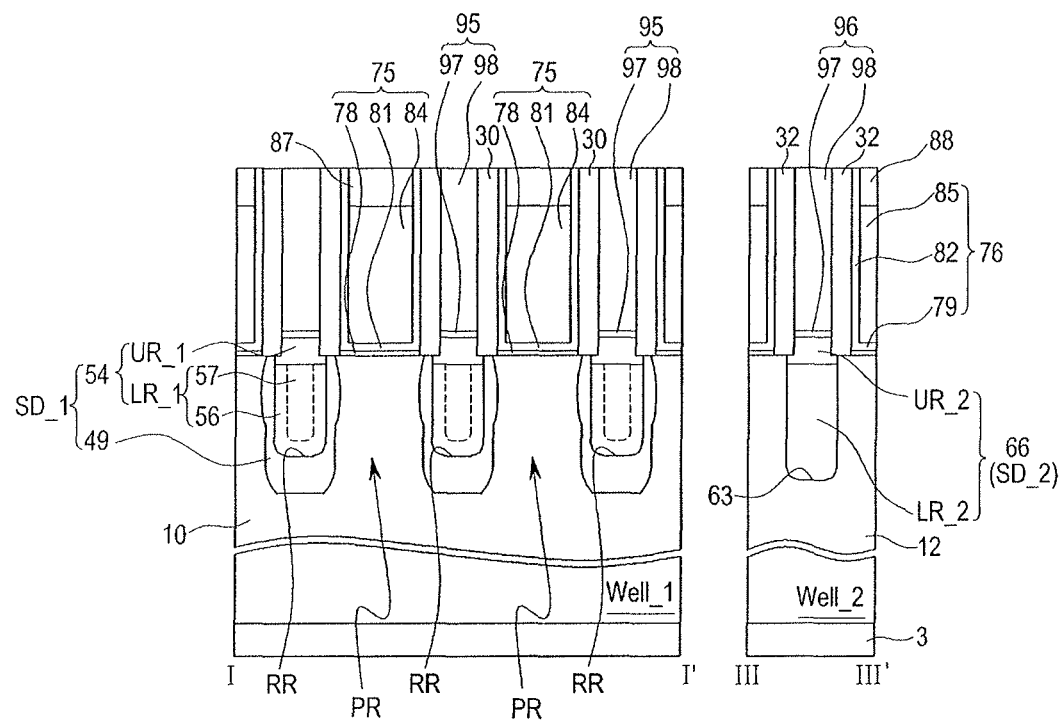
FIGS. 6A and 6B illustrate cross-sectional views of another modification of a semiconductor device according to an example embodiment.
Figure 6B:
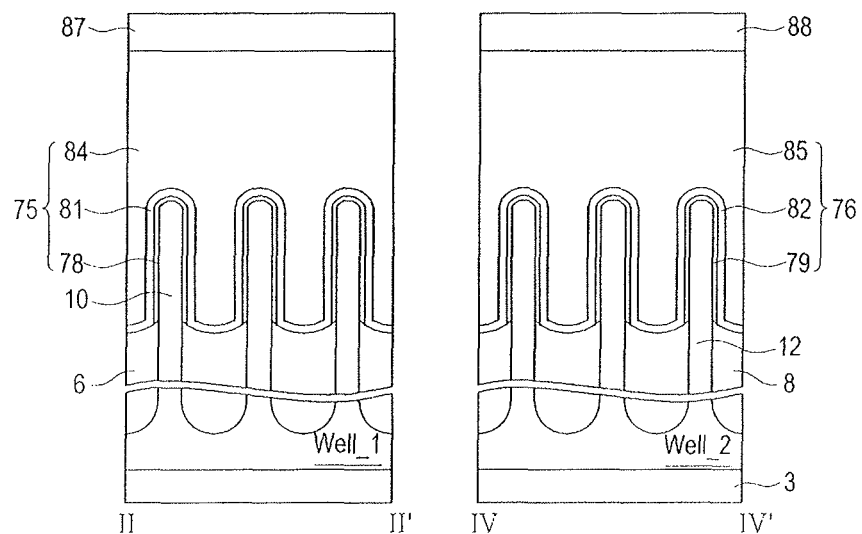

Referring to FIGS. 5, 6A, and 6B, the substrate 3 including the first transistor region TR_1 and the second transistor region TR_2 may be provided. The substrate 3 including the first transistor region TR_1 may have the components disposed thereon, as illustrated with reference to FIGS. 1, 2A, and 2B. Here, the first epitaxial layers 54 of the components illustrated with reference to FIGS. 1, 2A, and 2B may be modified to have the low concentration regions 56 and the high concentration regions 57 as illustrated in FIG. 3, and the impurity regions 49 may be modified to have side portions having a substantially uniform width, as illustrated in FIG. 4.

A second fin active region 12 may be disposed on a second well region Well_2 of the substrate 3 of the second transistor region TR_2 to pass through a second isolation region 8 and protrude onto the second isolation region 8, e.g. along the first direction. The second fin active region may extend along the second direction. The second well region Well_2 may have a conductivity type different from that of the first well region Well_1 included in the first transistor region TR_1. For example, the first well region Well_1 may have a P conductivity type, and the second well region Well_2 may have an N conductivity type. The second fin active region 12 may have the same conductivity type as that of the second well region Well_2.

Second gate structures 76 may extend onto the second isolation region 8, e.g., along the third direction, while intersecting the second fin active region 12. Each of the second gate structures 76 may include a second interface oxide layer 79, a second gate dielectric layer 82, and a second gate electrode 85. The second gate electrode 85 may extend onto the second isolation region 8, while intersecting the second fin active region 12, the second gate dielectric layer 82 may cover a bottom surface and a lateral surface of the first gate electrode 85, and the second interface oxide layer 79 may be disposed between the second gate dielectric layer 82 and the second fin active region 12.

The second gate structures 76 may have second gate capping patterns 88 disposed thereon. The second gate structures 76 and the second gate capping patterns 88 may have second insulating spacers 32 disposed on lateral surfaces thereof.

The second fin active region 12 may have a second recessed region 63. The second recessed region 63 of the second fin active region 12 may be disposed in a portion of the second fin active region 12 disposed between the second gate structures 76.

A second epitaxial layer 66 may be disposed in the second recessed region 63 of the second fin active region 12. The second epitaxial layer 66 may fill the second recessed region 63, and may protrude onto the second fin active region 12. The second epitaxial layer 66 may be a second source/drain region SD_2 of a P-channel metal oxide semiconductor (PMOS) transistor. The second epitaxial layer 66 may include a second lower region LR_2 and a second upper region UR_2 disposed on the second lower region LR_2. In an example embodiment, the second upper region UR_2 may have a higher impurity concentration than that of the second lower region LR_2.

In an example embodiment, the first source/drain regions SD_1 may include the impurity regions 49 surrounding the lateral surfaces and the bottom surfaces of the first epitaxial layers 54, and the source/drain region SD_2 may or may not include an impurity region surrounding the second epitaxial layer 66. Lateral surfaces and a bottom surface of the second epitaxial layer 66 may have the same conductivity type as that of the second epitaxial layer 66, and may or may not be surrounded by an impurity region, which may include a majority impurity formed of an element different from an element forming a majority impurity included in the second epitaxial layer 66.

The second epitaxial layer 66 may have a second contact structure 96 disposed thereon, having the same structure as that of the first contact structures 95, and formed of the same material as that of the first contact structures 95. The second contact structure 96 may include a metal silicide layer 97 and a contact plug 98 disposed on the metal silicide layer 97.

A method of forming a semiconductor device according to an example embodiment will next be described with reference to FIGS. 7A through 17.

Figure 7A:
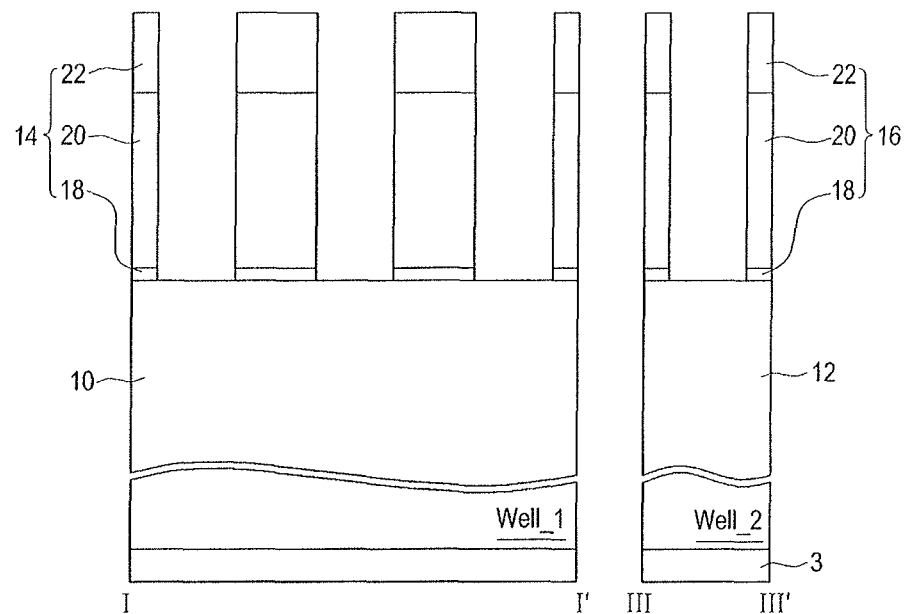
FIGS. 7A, 7B, and 8 through 17 illustrate cross-sectional views of a method of forming a semiconductor device according to an example embodiment.
Figure 7B:
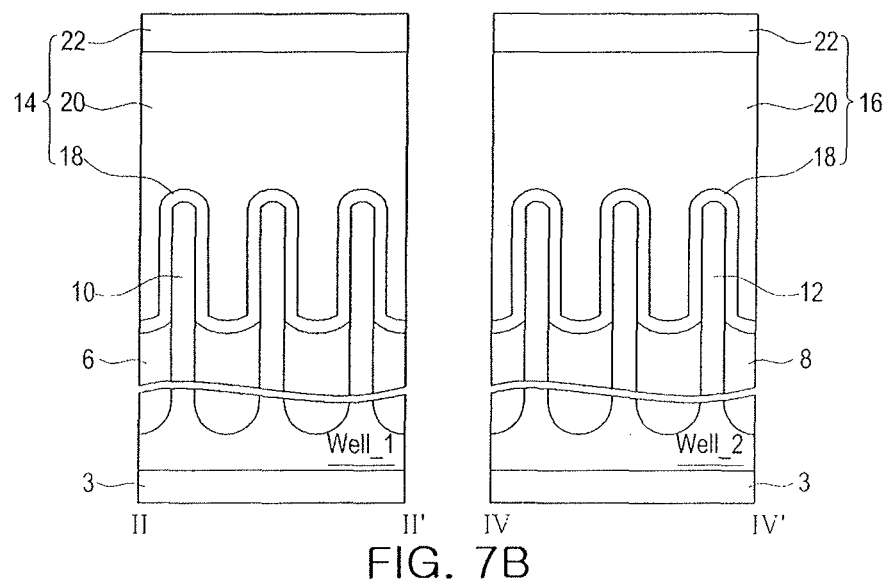

Referring to FIGS. 5, 7A, and 7B, the substrate 3 including a first transistor region TR_1 and a second transistor region TR_2 may be provided. The substrate 3 may be a semiconductor substrate. The second fin active region 12 may be formed on a portion of the substrate 3 of the second transistor region TR_2 to pass through a second isolation region 8 and protrude onto the second isolation region 8, e.g., along the first direction, and may extend along in the second direction. The first fin active region 10 may be formed on a portion of the substrate 3 of the first transistor region TR_1 to pass through a first isolation region 6 and protrude onto the first isolation region 6, e.g., along the first direction, and may extend in the second direction. The first fin active region 10 may be formed on the first well region Well_1 of the substrate 3, and the second fin active region 12 may be formed on a second well region Well_2 of the substrate 3. The first well region Well_1 may have a first conductivity type, and the second well region Well_2 may have a second conductivity type different from the first conductivity type. The first fin active region 10 may have the first conductivity type, and the second fin active region 12 may have the second conductivity type. In an example embodiment, the first conductivity type may be P-type, and the second conductivity type may be N-type.

First patterns 14, intersecting the first fin active region 10 and extending onto the first isolation region 6, and second patterns 16, intersecting the second fin active region 12 and extending onto the second isolation region 8, may be formed. Each of the first and second patterns 14 and 16 may include a buffer oxide layer 18, a preliminary gate pattern 20, and a mask pattern 22. The buffer oxide layer 18 may be formed of an insulating material, e.g., a silicon oxide, the preliminary gate pattern 20 may be formed of a polysilicon, and the mask pattern 22 may be formed of silicon nitride.

Figure 8:
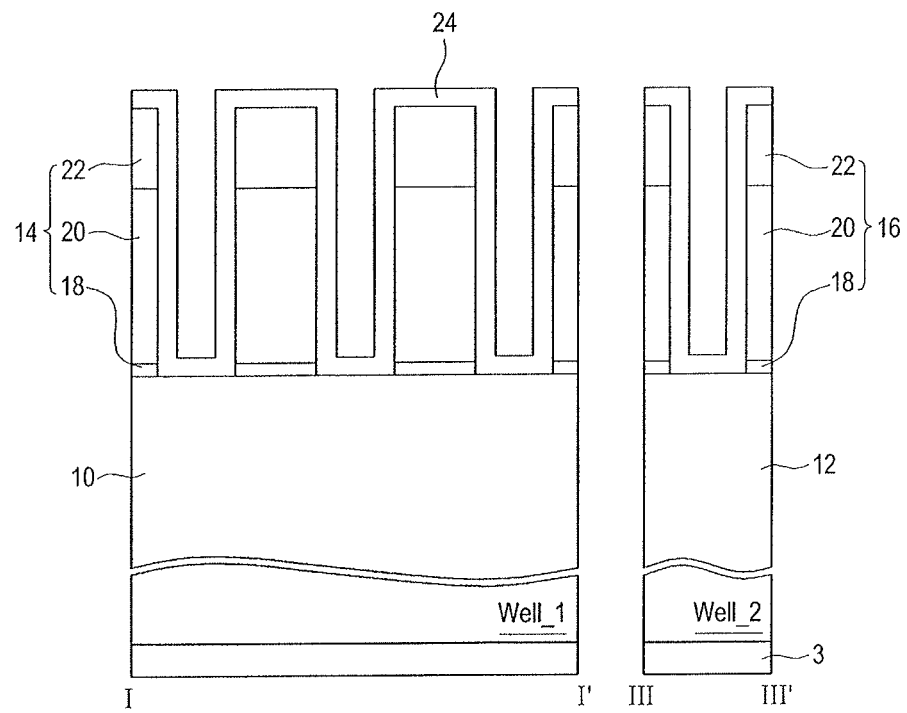

Referring to FIGS. 5 and 8, a spacer layer 24 may be formed on the first and second patterns 14 and 16 on the substrate 3. The spacer layer 24 may be formed of an insulating material including at least one of a silicon nitride, a silicon oxide, or a low-k dielectric material.

Figure 9:
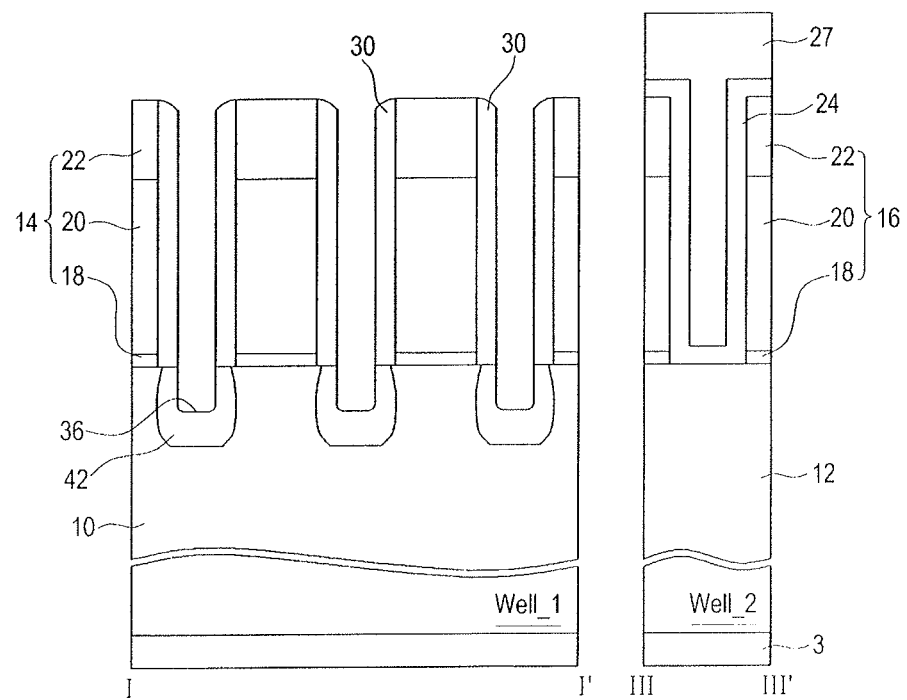

Referring to FIGS. 5 and 9, a mask 27 may be formed on the portion of the substrate 3 of the second transistor region TR_2. The mask 27 may cover the spacer layer 24 formed in the second transistor region TR_2. The mask 27 may be a spin on hardmask (SOH).

First insulating spacers 30 may be formed by etching portions of the spacer layer 24 formed in the first transistor region TR_1. Shallowly recessed regions 36 may be formed by etching portions of the first fin active region 10. The etching of the portions of the first fin active region 10 may be conducted using an anisotropic etching process.

First impurity regions 42 may be formed in portions of the first fin active region 10 adjacent to side walls and bottoms of the shallowly recessed regions 36. The first impurity regions 42 formed in the portions of the first fin active region 10 may be spaced apart from each other.

In an example embodiment, forming the first impurity regions 42 may include using an inclined ion implantation process. In a modified example embodiment, forming the first impurity regions 42 may include using a plasma doping process.

In another example embodiment, forming the first impurity regions 42 may include doping the first fin active region 10 with a first element, using an inclined ion implantation process or a plasma doping process. The first element may be an impurity, such as arsenic (As).

In an example embodiment, during a doping process for forming the first impurity regions 42, the first element may be injected into at least portions of the first insulating spacers 30.

In another example embodiment, forming the first impurity regions 42 may include doping the first fin active region 10 with the first element without an annealing process for diffusing an impurity. However, embodiments are not limited thereto. For example, the forming of the first impurity regions 42 may also include performing an annealing process for diffusing the first element while or after doping the first fin active region 10 with the first element.

Figure 10:
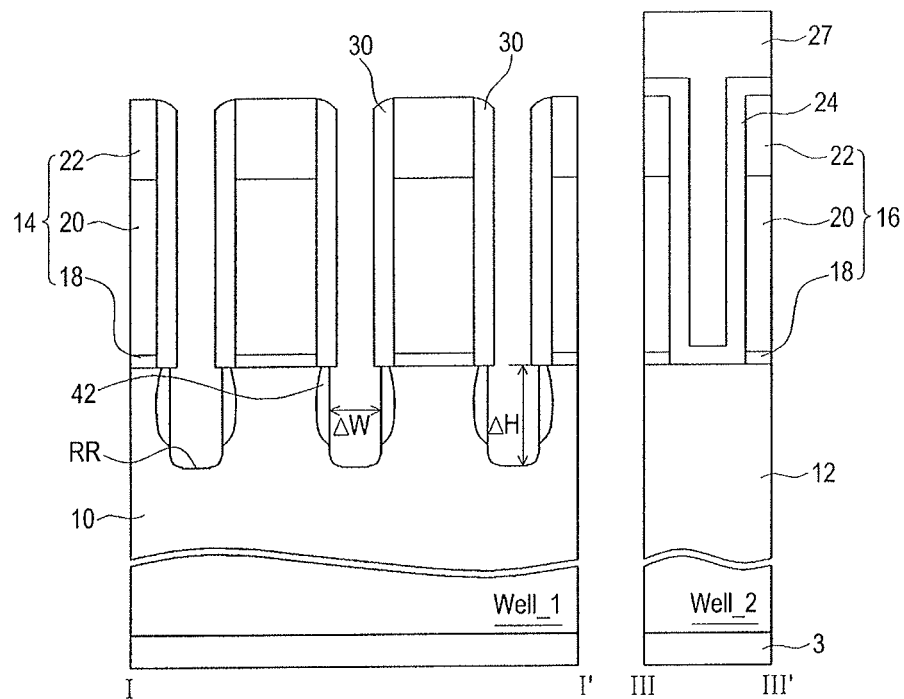

Referring to FIGS. 5 and 10, first recessed regions RR may be formed to have a width and a depth greater than those of the shallowly recessed regions 36 of FIG. 9 by etching portions of the first fin active region 10. The first recessed regions RR may be deeply recessed regions. The first recessed regions RR may pass through bottoms of the first impurity regions 42. The first impurity regions 42 may remain in the portions of the first fin active region 10, adjacent to side walls of the first recessed regions RR.

Figure 11:
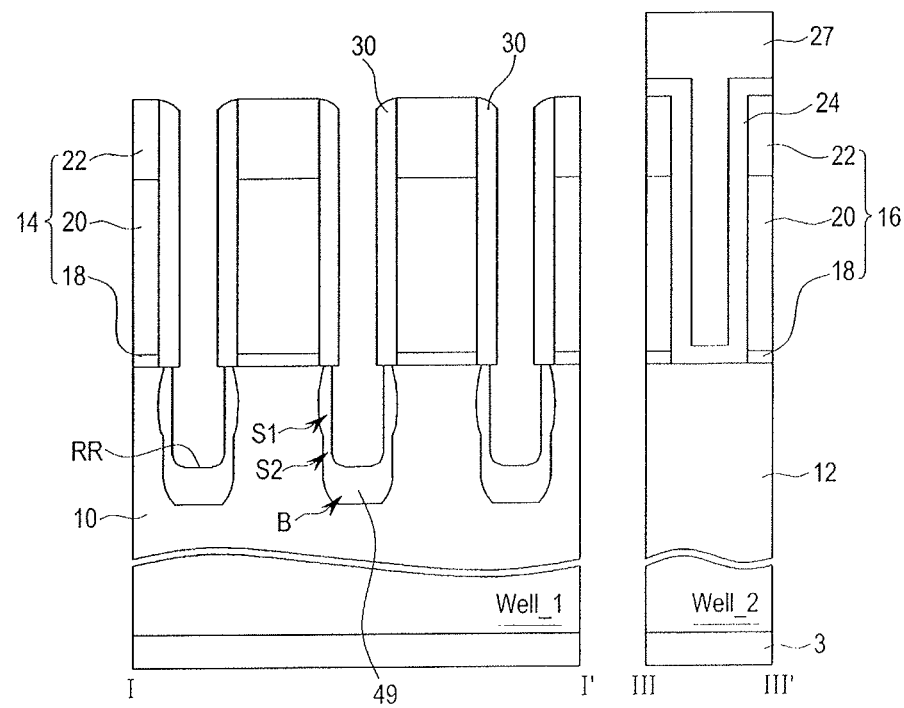

Referring to FIGS. 5 and 11, an inclined ion implantation process or a plasma doping process may be performed to inject an impurity into the portions of the first fin active region 10 adjacent to the side walls of the first recessed regions RR, thus forming impurity regions 49.

In an example embodiment, since the bottoms of the first recessed regions RR are lower than those of the shallowly recessed regions 36 of FIG. 9, an aspect ratio from the bottoms of the first recessed regions RR to an upper portion of a space between the first patterns 14 may be greater than an aspect ratio from the bottoms of the shallowly recessed regions 36 of FIG. 9 to the upper portion of the space between the first patterns 14. As the aspect ratio increases, an angle of incidence at which ions are injected may decrease. Thus, an impurity injected into the lateral surfaces of the first recessed regions RR, e.g., the deeply recessed regions RR, may be injected more shallowly than an impurity injected into the lateral surfaces of the shallowly recessed regions 36 of FIG. 9. Thus, each of side portions of the impurity regions 49 may include a first portion S1 and a second portion S2 injected more shallowly than the first portion S1, and disposed below the first portion S1. The side portions of the impurity regions 49 may face the side walls of the first recessed regions RR. Further, the impurity regions 49 may include bottom portions B disposed below the first recessed regions RR. A vertical length D of each of the bottom portions B of the impurity regions 49 may be greater than a horizontal width of each of the side portions of the impurity regions 49.

Figure 12:
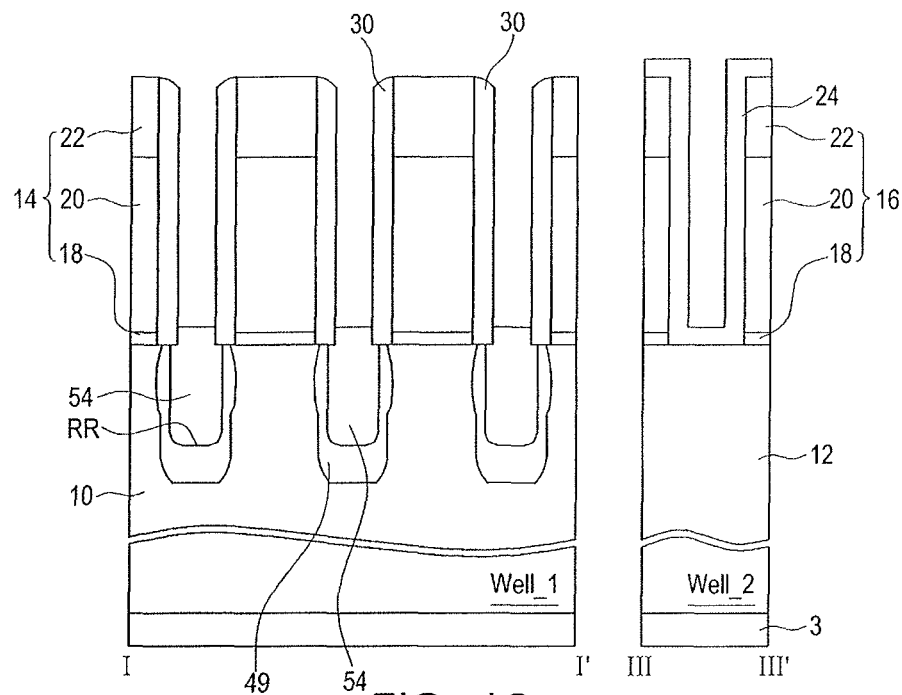

Referring to FIGS. 5 and 12, first epitaxial layers 54 may be formed on the first recessed regions RR by performing a selective epitaxial growth process.

In an example embodiment, the forming of the first epitaxial layers 54 may include cleaning the substrate 3 having the first recessed regions RR, and growing a semiconductor material layer from the side walls and the bottoms of the first recessed regions RR by performing the selective epitaxial growth process.

In an example embodiment, the first epitaxial layers 54 may include silicon epitaxial layers. However, embodiments are not limited thereto. For example, the first epitaxial layers 54 may also include at least one of a silicon epitaxial layer, a silicon germanium epitaxial layer, or a germanium epitaxial layer.

In an example embodiment, the first epitaxial layers 54 may have the same conductivity type as that of the impurity regions 49, and may be doped with an element different from that forming the impurity regions 49. For example, the impurity regions 49 may be doped with arsenic (As), and the first epitaxial layers 54 may be doped with phosphorus (P), using an in-situ process.

In a modified example embodiment, the first epitaxial layers 54 may be formed to have the low concentration regions 56, and may then be formed to have the high concentration regions 57, as illustrated in FIG. 3. For example, the forming of the first epitaxial layers 54 may include growing a semiconductor layer doped with a low concentration of phosphorus (P), and then growing a semiconductor layer doped with a high concentration of phosphorus (P) from the bottoms and the side walls of the first recessed regions RR, using the in-situ process.

Figure 13:
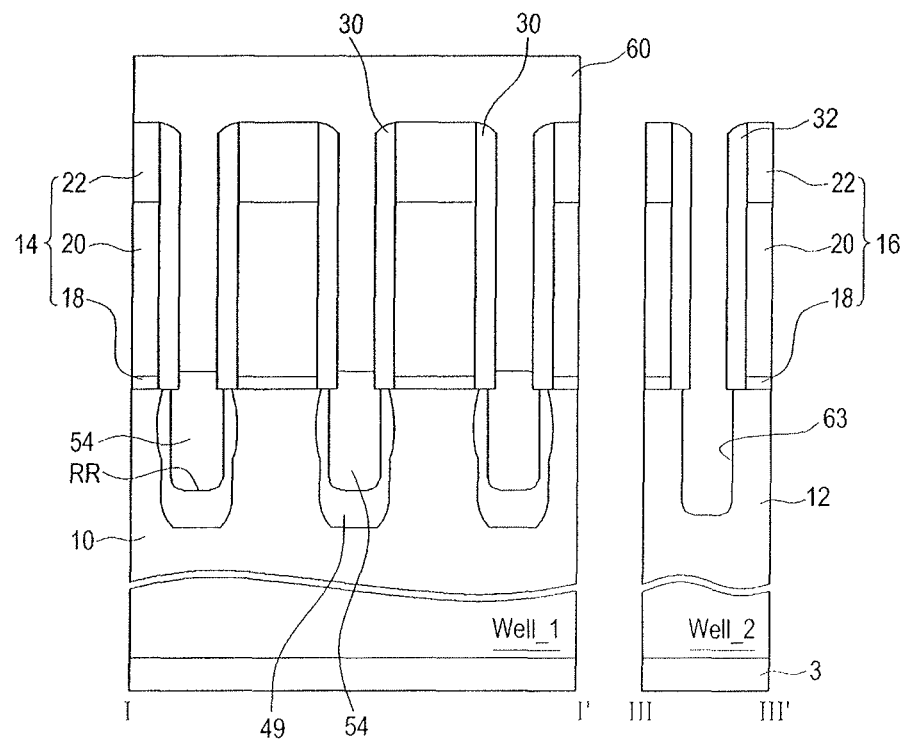

Referring to FIGS. 5 and 13, second insulating spacers 32 may be formed by etching portions of the spacer layer 24 formed in the second transistor region TR_2. A second epitaxial layer 63 may be selectively formed in the second recessed region 63 of the second fin active region 12.

Forming the second insulating spacers 32 and the second recessed region 63 may include forming a mask 60 covering the first transistor region TR_1, and allowing for exposure of the second transistor region TR_2, forming the second insulating spacers 32 by etching the portions of the spacer layer 24 formed in the second transistor region TR_2, and forming the second recessed region 63 by etching a portion of the second fin active region 12 using the mask 60, the second patterns 16, and the second insulating spacers 32 as etching masks.

Figure 14:
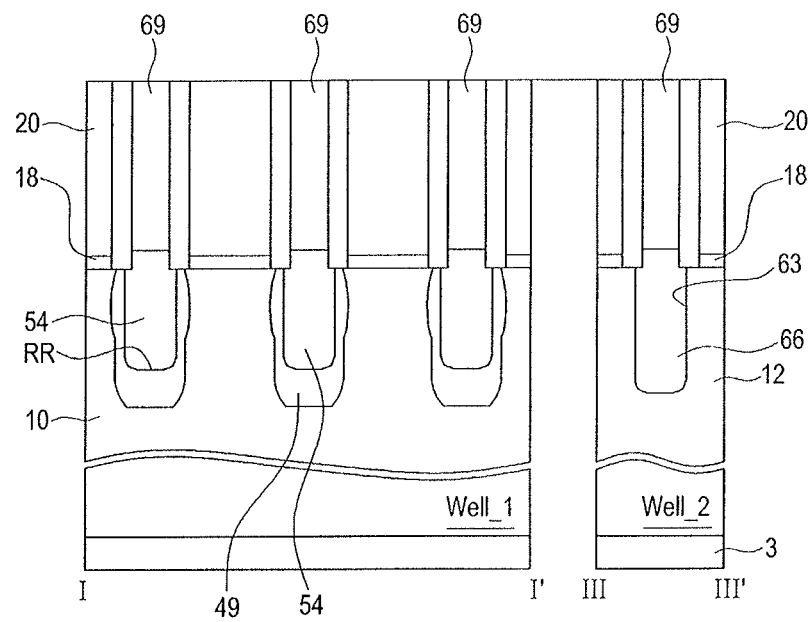

Referring to FIGS. 5 and 14, the mask 60 may be removed. The second epitaxial layer 66 may be selectively formed in the second recessed region 63. The second epitaxial layer 66 may have a conductivity type different from that of the first epitaxial layers 54.

Interlayer insulating layers 69 may be formed by forming an insulating material on the substrate 3 having the first and second epitaxial layers 54 and 66 and flattening, e.g., planarizing, the insulating material until the preliminary gate patterns 20 are exposed, while removing the mask patterns 22.

Figure 15:
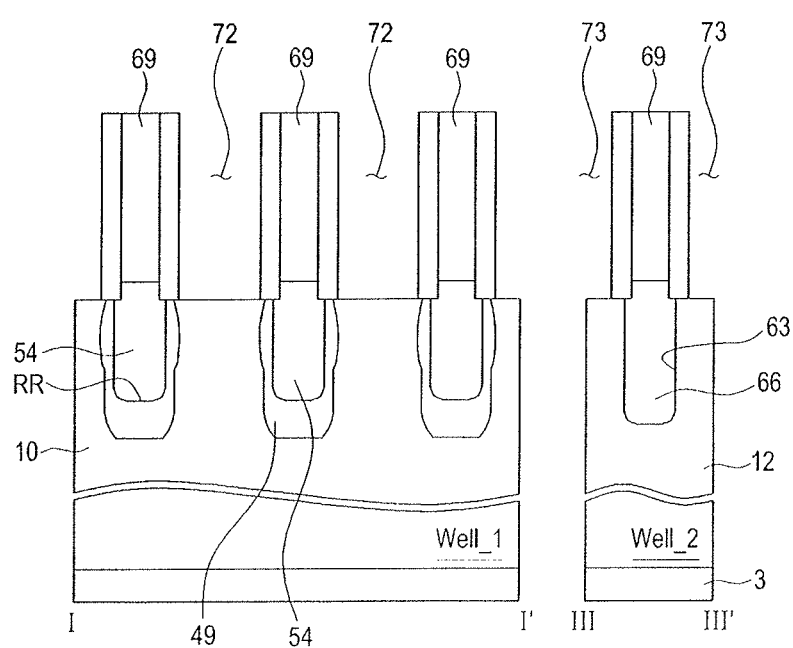

Referring to FIGS. 5 and 15, second gate trenches 73 may be formed in the second transistor region TR_2 while forming first gate trenches 72 in the first transistor region TR_1 by selectively removing the preliminary gate patterns 20 and the buffer oxide layers 18.

Figure 16:
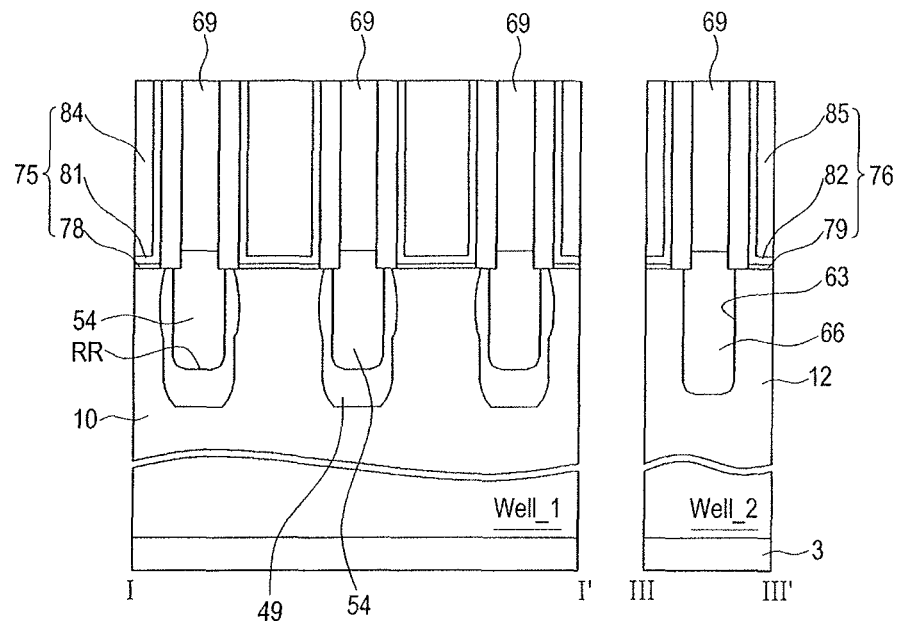

Referring to FIGS. 5 and 16, the first gate structures 75 may be formed in the first gate trenches 72, and the second gate structures 76 may be formed in the second gate trenches 73. Each of the first gate structures 75 may include the first interface oxide layer 78, the first gate dielectric layer 81, and the first gate electrode 84. Each of the second gate structures 76 may include the second interface oxide layer 79, the second gate dielectric layer 82, and the second gate electrode 85.

Figure 17:
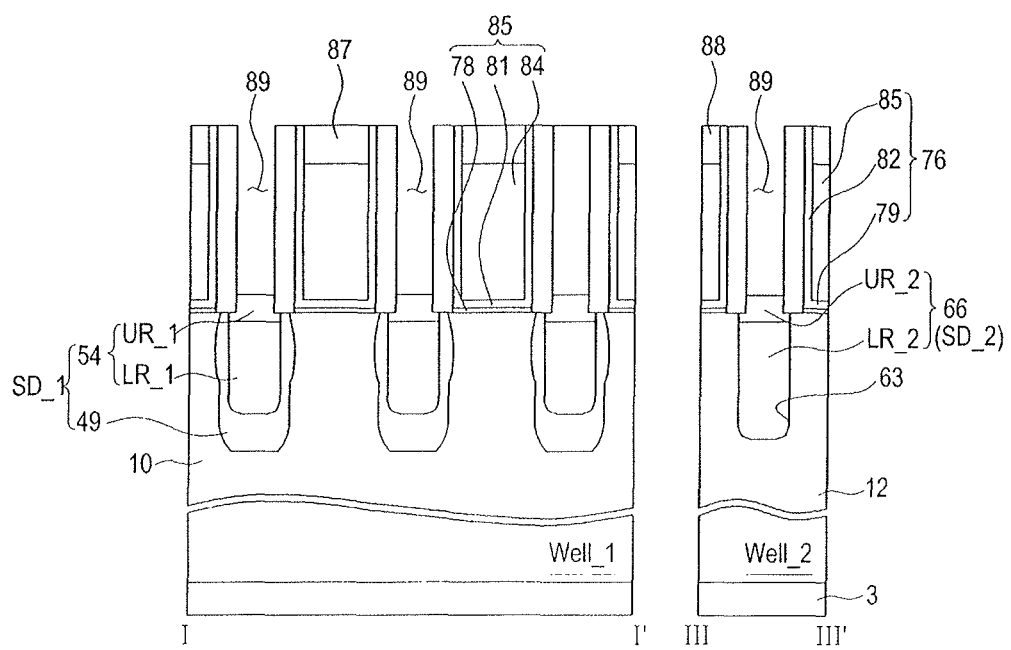

Referring to FIGS. 5 and 17, first gate capping patterns 87 may be formed on the first gate electrode 84, and second gate capping patterns 88 may be formed on the second gate electrode 85. Each of the first and second gate capping patterns 87 and 88 may be formed of an insulating material, e.g., silicon oxide.

Referring to FIGS. 5 and 17, contact openings 89, exposing the first and second epitaxial layers 54 and 66, may be formed by patterning the interlayer insulating layers 69. First upper regions UR_1 may be formed by injecting a first impurity into the first epitaxial layers 54, and the second upper regions UR_2 may be formed by injecting a second impurity, different from the first impurity, into the second epitaxial layer 66.

In the first epitaxial layers 54, lower parts of the first upper regions UR_1 may be referred to as the first lower regions LR_1. In the second epitaxial layer 66, a lower part of the second upper region UR_2 may be referred to as the second lower region LR_2.

In the first epitaxial layers 54, the first upper regions UR_1 may have a higher impurity concentration than that of the first lower regions LR_1. In the second epitaxial layer 66, the second upper region UR_2 may have a higher impurity concentration than that of the second lower region LR_2.

The first epitaxial layers 54 and the impurity regions 49 may be the first source/drain regions SD_1, formed in the first transistor region TR_1, and the second epitaxial layer 66 may be the second source/drain region SD_2, formed in the second transistor region TR_2.

Referring to FIGS. 5, 6A, and 6B, the first contact structures 95 may be formed on the first epitaxial layers 54, while the second contact structure 96 may be formed on the second epitaxial layer 66. Each of the first and second contact structures 95 and 96 may include the metal silicide layer 97 and the contact plug 98 disposed on the metal silicide layer 97.

Figure 18:
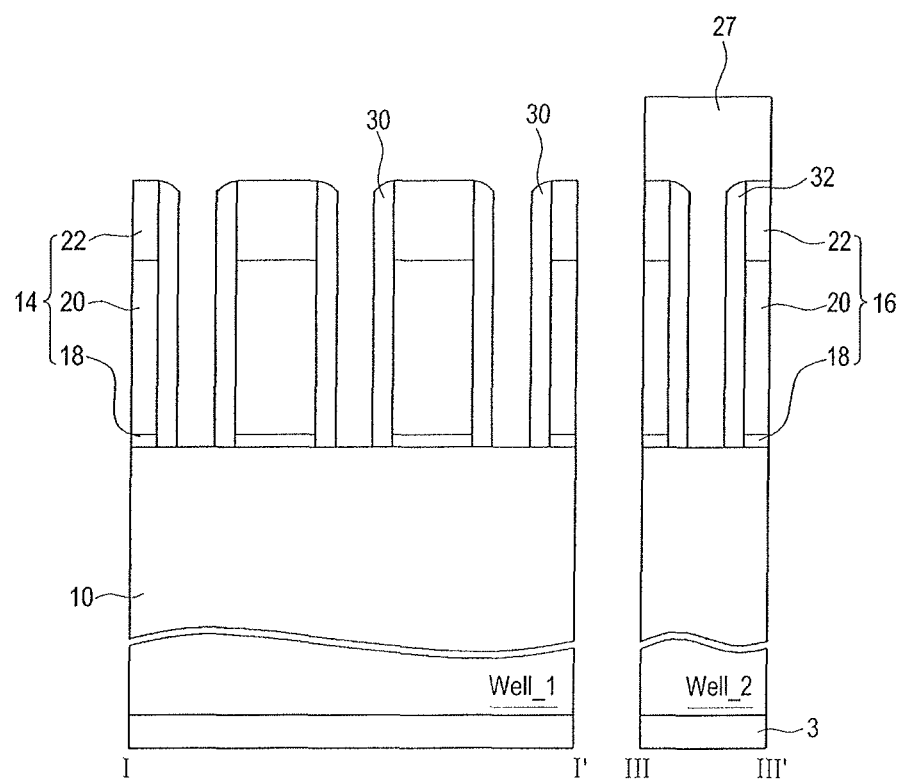
FIG. 18 illustrates a cross-sectional view of a modification of a method of forming a semiconductor device according to an example embodiment.
Figure 19:
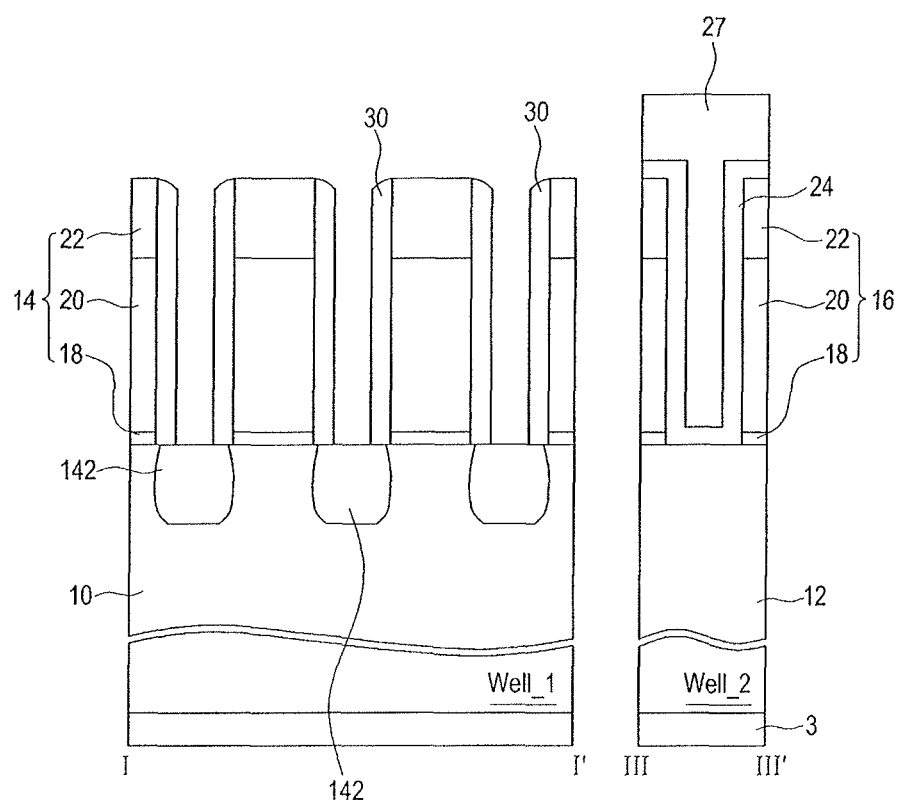
FIG. 19 illustrates a cross-sectional view of a modification of a method of forming a semiconductor device according to an example embodiment.
Figure 20:
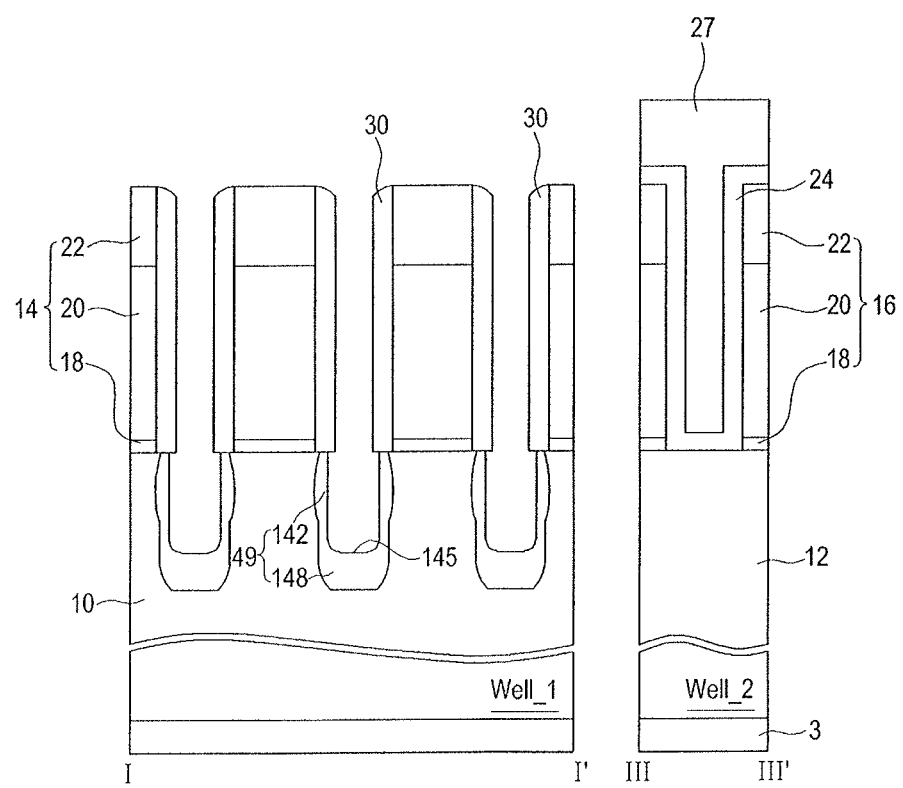
FIG. 20 illustrates a cross-sectional view of a modification of a method of forming a semiconductor device according to an example embodiment.

A method of forming a semiconductor device according to an example embodiment may include forming the spacer layer 24, as illustrated in FIG. 8, forming the mask 27 covering the second transistor region TR_2, forming the first insulating spacers 30 by etching the portions of the spacer layer 24 formed in the first transistor region TR_1, as illustrated in FIG. 9, and forming the shallowly recessed regions 36 by etching the portions of the first fin active region 10. However, embodiments are not limited thereto. For example, the method of forming a semiconductor device may also include forming the spacer layer 24, as illustrated in FIG. 8, forming the second insulating spacers 32 in the second transistor region TR_2 while forming the first insulating spacers 30 in the first transistor region TR_1 by anisotropically etching the portions of the spacer layer 24 of FIG. 8, as illustrated in FIG. 18, forming the mask 27 covering the second transistor region TR_2, and performing an etching process for forming the shallowly recessed regions 36, illustrated in FIG. 9.

A method of forming a semiconductor device according to an example embodiment may include forming the shallowly recessed regions 36, as illustrated in FIG. 9, forming the first impurity regions 42, and the first recessed regions RR, as illustrated in FIG. 10. However, embodiments are not limited thereto. For example, the method of forming a semiconductor device may also include forming first impurity regions 142 in portions of the first fin active region 10 between the first patterns 14, forming deeply recessed regions RR corresponding to the deeply recessed regions RR illustrated in FIG. 10, and forming second impurity regions 148 below the first impurity regions 142, thereby forming impurity regions 149 corresponding to the impurity regions 49 illustrated in FIG. 11.

As set forth above, according to example embodiments, the first source/drain region SD_1 may include the first epitaxial layer 54 and the impurity region 49 surrounding the lateral surfaces and the bottom surface of the first epitaxial layer 54. The impurity region 49 may include a majority impurity that is different from the majority impurity included in the first epitaxial layer 54, while having the same conductivity type as the conductivity type of the first epitaxial layer 54. The majority impurity included in the impurity region 49 may include an element having a lower degree of diffusion than the element forming the majority impurity included in the first epitaxial layer 54. The impurity region 49 may be formed by performing a doping process at least two times, and the bottom portion B of the impurity region 49 positioned below the bottom surface of the first epitaxial layer 54 may be formed using a one-time doping process. Thus, according to example embodiments, an excessive amount of an impurity may be prevented from being injected and diffused into the bottom portion B of the impurity region 49. As a result, the structure of the first source/drain SD_1 and the method of forming the first source/drain SD_1 that may more easily control a short channel due to a high integration trend of a semiconductor device may be provided, thereby inhibiting a defect in and improving reliability of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. Method of forming a semiconductor device, comprising:
   forming a fin active region on a substrate;
   forming patterns on the fin active region;
   etching the fin active region using the patterns as etching mask, and forming a recessed region in the fin active region;
   forming impurity region in the fin active region adjacent to the recessed region; and
   forming a epitaxial layer in the recessed region,
   wherein the epitaxial layer has the same conductivity type as a conductivity type of the impurity region; and
   wherein the impurity region surrounds lateral surfaces and a bottom surface of the epitaxial layer and has a majority impurity different from a majority impurity included in at least a portion of the epitaxial layer.

2. The method of claim 1, wherein the impurity region includes side portions facing the lateral surfaces of the epitaxial layer and a bottom portion facing the bottom surface of the epitaxial layer, and a vertical length of the bottom portion of the impurity region is greater than a width of each of the side portions of the impurity region.

3. The method of claim 2, wherein each of the side portions of the impurity region includes a first portion having a first width and a second portion disposed below the first portion, and having a second width narrower than the first width.

4. The method of claim 1, wherein the majority impurity included in the impurity region is a first element, and the majority impurity included in the at least a portion of the epitaxial layer is a second element having a higher degree of diffusion than a degree of diffusion of the first element.

5. The method of claim 1, further comprising:
   forming an interlayer insulating layer on the epitaxial layer;
   forming gate trenches by removing the patterns; and
   forming a gate structure in the gate trenches.

6. The method of claim 5, further comprising:
   forming a contact opening exposing the epitaxial layer by patterning the interlayer insulating layer; and
   forming a contact structure in the contact opening.

7. The method of claim 6, further comprising forming an upper region in the epitaxial layer by injecting impurities into the epitaxial layer, wherein the upper region of the epitaxial layer has a higher impurity concentration than a impurity concentration of a lower region of the epitaxial layer.

8. Method of forming a semiconductor device, comprising:
   forming a fin active region on a substrate;
   forming patterns on the fin active region;
   forming insulating spacers on lateral surfaces of the patterns;
   etching the fin active region using the patterns and the insulating spacers as etching mask, thereby forming a recessed region in the fin active region;
   forming an impurity region in the fin active region; and
   forming an epitaxial layer in the recessed region,
   wherein forming the recessed region and the impurity region includes:
      forming a shallowly recessed region by etching the fin active region using the patterns and the insulating spacers as etching mask;
      doping a fin active region adjacent to the shallowly recessed region with a first element;
      forming a deeply recessed region by etching the fin active region adjacent the shallowly recessed region using the patterns and the insulating spacers as etching mask; and
      doping a fin active region adjacent to the deeply recessed region with the first element.

9. The method of claim 8, wherein the impurity region surrounds lateral surfaces and a bottom surface of the epitaxial layer.

10. The method of claim 8, wherein forming an epitaxial layer in the recessed region includes growing a semiconductor material layer from lateral surfaces and a bottom surface of the recessed region by performing a selective epitaxial growth process.

11. The method of claim 8, wherein the epitaxial layer has the same conductivity type as a conductivity type of the impurity region.

12. The method of claim 11, wherein the epitaxial layer is doped with a second element different from the first element, and wherein the first element is arsenic (As) and the second element is phosphorus (P).

13. The method of claim 12, forming an impurity region in the fin active region includes doping the fin active region with the first element using an inclined ion implantation process or a plasma doping process.

14. The method of claim 8, further comprising:
forming an interlayer insulating layer on the epitaxial layer;
forming gate trenches by removing the patterns;
forming a gate structures in the gate trenches;
forming a contact opening exposing the epitaxial layer by patterning the interlayer insulating layer; and
forming a contact structure in the contact opening.

15. The method of claim 14, wherein side walls of the recessed region overlap bottom surfaces of the insulating spacers while being spaced apart from the gate structures.

16. Method of forming a semiconductor device, comprising:
forming a fin active region having protruding regions and a recessed region between the protruding regions;
forming an impurity region in the fin active region adjacent to the recessed region;
forming an epitaxial layer in the recessed region, wherein the epitaxial layer has a height greater than a width; and
forming gate structures overlapping the protruding regions,
wherein the impurity region surrounds lateral surfaces and a bottom surface of the epitaxial layer and has a majority impurity different from a majority impurity included in at least a portion of the epitaxial layer.

17. The method of claim 16, wherein the impurity region includes side portions facing the lateral surfaces of the epitaxial layer and a bottom portion facing the bottom surface of the epitaxial layer, and a vertical length of the bottom portion the impurity region is greater than a width of each of the side portions of the impurity region.

18. The method of claim 17, wherein each of the side portions of the impurity region includes a first portion having a first width and a second portion disposed below the first portion, and having a second width narrower than the first width.

19. The method of claim 16, wherein the majority impurity included in the impurity region is a first element, and the majority impurity included in the at least a portion of the epitaxial layer is a second element having a higher degree of diffusion than a degree of diffusion of the first element.

20. The method of claim 16, further comprising forming a contact structure on the epitaxial layer, wherein the contact structure is spaced apart from the impurity region.

* * * * *